(12) United States Patent
Mattila et al.

(10) Patent No.: US 8,029,722 B2
(45) Date of Patent: Oct. 4, 2011

(54) METHOD OF FABRICATING STRUCTURES BASED ON NANOPARTICLES

(75) Inventors: Tomi Mattila, Espoo (FI); Ari Alastalo, Klaukkala (FI); Mark Allen, Espoo (FI); Heikki Seppä, Helsinki (FI)

(73) Assignee: Valtion Teknillinen Tutkimuskeskus, Espoo (FI)

( * ) Notice: Subject to any disclaimer, the term of this patent is extended or adjusted under 35 U.S.C. 154(b) by 129 days.

(21) Appl. No.: 12/155,668

(22) Filed: Jun. 6, 2008

(65) Prior Publication Data

US 2009/0081431 A1 Mar. 26, 2009

(30) Foreign Application Priority Data

Jun. 8, 2007 (FI) .................................... 20075431

(51) Int. Cl.
*B29C 67/00* (2006.01)
*H05B 7/00* (2006.01)
*H01L 21/82* (2006.01)

(52) U.S. Cl. ........ 264/450; 264/461; 438/131; 438/132; 977/932

(58) Field of Classification Search ........................ None
See application file for complete search history.

(56) References Cited

U.S. PATENT DOCUMENTS

| | | | | |
|---|---|---|---|---|
| 5,266,829 A | * | 11/1993 | Hamdy et al. ................. | 257/530 |
| 5,753,540 A | * | 5/1998 | Wu et al. ........................ | 438/131 |
| 5,834,824 A | * | 11/1998 | Shepherd et al. .............. | 257/530 |
| 5,906,042 A | * | 5/1999 | Lan et al. ......................... | 29/852 |
| 5,906,043 A | * | 5/1999 | Lan et al. ......................... | 29/852 |
| 5,962,815 A | * | 10/1999 | Lan et al. ....................... | 174/262 |
| 6,807,079 B2 | * | 10/2004 | Mei et al. ......................... | 365/96 |
| 2005/0238804 A1 | * | 10/2005 | Garbar et al. ................. | 427/180 |
| 2007/0045604 A1 | | 3/2007 | Liu et al. | |
| 2009/0014821 A1 | * | 1/2009 | Mattila et al. ................. | 257/428 |
| 2009/0016924 A1 | * | 1/2009 | Allen et al. ........................ | 419/9 |
| 2009/0301769 A1 | * | 12/2009 | Sepp et al. .................... | 174/257 |

FOREIGN PATENT DOCUMENTS

WO WO-2007 030483 A3 3/2007

OTHER PUBLICATIONS

A novel BaTiO3/SiO2-based voltage-programmable link applicable to on-chip programmable devices J S Lee et al 2000 Semicond. Sci. Technol. vol. 15 pp. 267-269.*

(Continued)

*Primary Examiner* — Christina Johnson
*Assistant Examiner* — Benjamin Schiffman
(74) *Attorney, Agent, or Firm* — Birch, Stewart, Kolasch & Birch, LLP

(57) ABSTRACT

This publication discloses a method for creating nanoscale formations. According to the method, a filler matrix and first nanoparticles embedded in the filler matrix, and two conductive electrodes are superimposed on the insulating material layer. According to the invention, a voltage is applied between the conductive electrodes, a filler matrix is used and first nanoparticles have substantially different electrical properties in order to induce self-organized localized contact creation when said voltage is applied. Potential applications of the invention include e.g. parallel-plate capacitor structures based on metal-oxide nanoparticles, such as memory cells, and high-permittivity/tunable capacitors.

28 Claims, 11 Drawing Sheets

OTHER PUBLICATIONS

Bong Kyun Park, Dongjo Kim, Sunho Jeong, Jooho Moon, Jang Sub Kim, Direct writing of copper conductive patterns by ink-jet printing, Thin Solid Films, vol. 515, Issue 19, Proceedings of Symposium I on Thin Films for Large Area Electronics EMRS 2007 Conference—EMRS 2006—Symposium I, Jul. 16, 2007, pp. 7706-7711.*

Jae Sung Lee, Young Hyun Lee, Metal-to-metal antifuse with amorphous Ti-rich barium titanate film and silicon oxide film, Solid-State Electronics, vol. 43, Issue 3, Mar. 1999, pp. 469-472.*

E 2456-06 Terminology for Nanotechnology, Nov. 2006, ASTM.*

Huang, "Barium Titanate Nanocrystals and Nanocrystal Thin Films: Synthesis, Ferroelectricity, and Dielectric Properties", Journal of Applied Physics 100, 2006, pp. 034316-1-034316-10.

Ray, et al., "Direct Observation of Ferroelectricity in Quasi-Zero-Dimensional Barium Titanate Nanoparticles", Nano Micro Small Journal, 2006, 2, No. 12, pp. 1427-1431.

* cited by examiner

METHOD OF FABRICATING STRUCTURES BASED ON NANOPARTICLES

FIELD OF THE INVENTION

The present invention relates to novel uses of nanoparticles, in particular electronic structures, and the fabrication method of the same, which contain nanoparticles. Potential applications of the invention include e.g. memory cells and capacitors. The invention is particularly advantageous in the field of printed electronics.

BACKGROUND OF THE INVENTION

Metal-oxide nanoparticles offer large potential for electronic applications. Materials include e.g. titanium-oxides ($BaTiO_3$, $SrTiO_3$, $TiO_2$, $PbZrTiO_3$, etc.). A key characteristic property of these materials is their high relative permittivity $\in_r$ (for example, $\in_r^{TiO2} \sim 80$, $\in_r^{SrTiO3} \sim 300$, $\in_r^{BaTiO3} \sim 1000$).

Of particular interest are also the ferroelectric properties for some of these materials: for example, the spontaneous polarization and piezoelectricity (e.g. $BaTiO_3$) [L. Huang et al., Barium titanate nanocrystals and nanocrystal thin films: Synthesis, ferroelectricity, and dielectric properties, J. Appl. Phys. 100, 034316 (2006); S. Ray et al., Direct observation of Ferroelectricity in Quasi-Zero-Dimensional Barium Titanate Nanoparticles, small 2, 1427 (2006)], and the tunable dielectric permittivity (e.g. $SrTiO_3$, $Ba_xSr_{1-x}TiO_3$).

Another characteristic property of metal-oxides is their high material stability (e.g. high melting temperatures, hardness, stability against ambient air, etc.).

However, there exist several problems in realization of practical devices based on metal-oxide nanoparticles. As an example, let us consider the realization of a parallel plate capacitor where the middle insulating layer (between the well-conducting electrodes typically of metal) is intended to be made of the metal-oxide nanoparticles. The metal-oxide nanoparticles, deposited on the first electrode, tend to form a porous structure, which is prone to formation of electrical shorts when the second electrode is deposited. Furthermore, the mechanical stability of the metal-oxide nanoparticle layer is typically not good; in particular, the interparticle adhesion and the adhesion to the electrodes are typically inadequate.

To avoid the above problems, nanoparticles can be embedded in an insulating matrix (filler). The matrix material provides the insulation property (i.e. prevents electrical shorts) and the adhesive properties. However, due to application of the matrix material, a series capacitance is created between the particle and the well-conducting electrodes. This series capacitance is highly undesirable as it e.g. screens the embedded nanoparticle from the electric field applied between the electrodes. As one of the consequences, the effective capacitance of the structure can be drastically reduced. The problem is well illustrated e.g. in the case of a ferroelectric memory cell. The relative permittivity of the insulating "filler" material is typically substantially smaller than for the high-epsilon ferroelectric nanoparticle, thus causing a substantial potential drop already at small thickness. Depolarizing field is induced which limits, for example, the polarization stability (decreased memory retention time). From another viewpoint, the insulating property (required for preventing shorts between the electrodes) hinders the charge flow over the series capacitance, which can cause substantial delay in transferring the applied voltage to actually occur across the nanoparticle. A further complication arises for memory readout: the state of the ferroelectric memory cell is conventionally read by applying an electric pulse to the memory capacitor (opposite pulse polarity causes polarization reversal and related charge pulse is detected; parallel polarity does not cause the effect). The high impedance and the potentially low conductance of the series capacitance can induce drawbacks for an effective pulse readout.

The present invention is also related to other types of non-volatile memory. In particular, the phase change materials, also known as chalcogenide, or ovonic materials, have emerged as a potential candidate for high-density storage. The chalcogenide material is typically electrically heated (above 600° C.) to induce the phase transformation. Based on the electrical exposure (i.e. the intensity of the heating pulse), the material phase can be alternated between crystalline and amorphous. The two phases typically exhibit at least an order of magnitude difference in their electrical conductivity. The stored bit is thus coded in the electrical conductivity of the memory cell, and written electrically.

A central problem in the chalcogenide memories is to obtain sufficiently large current density j ($A/m^2$) to induce the phase transformation In practice, this is typically translated into obtaining a sufficiently small electrode area. The minimum linewidths using printing fabrication methods (e.g. gravure or inkjet printing) are typically of the order of tens of micrometers (orders-of-magnitude larger than the state-of-the-art IC-fabrication process linewidths). Thus, reaching the required current densities becomes impractical e.g. in the standard sandwich (parallel-plate) memory cell configuration.

WO 2007/030483 discloses a method of using nanotube elements in the form of non-woven nanotube fabric as heating elements in memories.

US 2007/0045604 discloses a chalcogenide-based programmable conductor memory device. A conductive nanoparticle (e.g. tungsten, titanium nitride, platinum, palladium, ruthenium) is provided on the surface of an electrode for achieving a high electrical field strength in the vicinity of the nanoparticle for achieving a narrow current channel in a memory material. One of the drawbacks in this design is that the particle has to be in good electrical contact with the electrode, which makes the fabrication of the device inconvenient. Thus, there is a need for novel types of structures and methods providing for relaxed manufacturing tolerances, in particular with respect to the positioning accuracy of the electrodes and the nanoparticles.

SUMMARY OF THE INVENTION

It is an aim of the invention to overcome at least some of the problems described above and to provide a novel method for utilizing nanoparticles and the like for achieving very dense electrode-to-nanoparticle contacts for a plurality of applications.

In particular, it is an aim of the invention to provide a method and structure, by means of which ultra small (localized) electrode terminals are obtained in capacitor-like structures.

The invention is based on the finding that individual nanoparticles in a filler matrix can be used for concentrating electrical field in sandwich structures for forming contacts from the nanoparticles to closely-positioned electrodes, provided that the material conditions are favourable. It has namely been found that nanoparticles, which possess very dissimilar electric properties, in particular relative permittivity, than their surrounding material, may concentrate electric field in their vicinity in micro-scale such that a very localized structural contact-establishing transformation in the nearby materials may take place, even if the nanoparticles are at a distance from, i.e. not in ohmic contact with the electrodes.

Thus, in the method according to the invention nanoparticles are utilized for electrode-nanoparticle contact creation in a structure comprising a filler matrix and first nanoparticles embedded in the filler matrix and two conductive electrodes superimposed on opposite sides the intermediate layer. According to the invention, the filler matrix and first nanoparticles have substantially different electrical properties, in particular relative permittivity, in order to induce a localized structural transformation between the electrodes and individual first nanoparticles when a voltage is applied between the electrodes. In particular, first nanoparticles comprising metal-oxide are used for achieving the localized transformation in their vicinity.

The invention provides also a new use for nanoparticles having a high relative permittivity, such as metal-oxide nanoparticles, for forming nanoscale contact electrodes to the nanoparticles which may serve as memory elements in the structure.

The filler matrix comprising the nanoparticles is preferably an intermediate layer in a sandwich structure having the electrodes as outer layers.

The electronics module according to the invention comprises a sandwich structure of the above kind. The electronics module forms thus a capacitor-like structure. If the filler matrix, and the first nanoparticles are insulator materials, the module can be used as a capacitor, memory unit of a memory cell.

According to one aspect of the invention there is provided a method for creating an electrical contact from conductive electrodes to first nanoparticles in a sandwich structure by (i) applying a voltage between the conductive electrodes, and (ii) using an insulating matrix and first nanoparticles having substantially higher permittivity than the filler matrix in order to induce self-organized localized electrode-nanoparticle contact creation when said voltage is applied. The nanoparticles used preferably have a substantially higher relative permittivity (typically at least 10-fold) than the insulating matrix. Such materials include metal oxides such as $BaTiO_3$, $SrTiO_3$, $TiO_2$ or $PbZrTiO_3$.

In addition to metal-oxide nanoparticles, metal-fluoride, metal-nitride, metal-sulfide, metal-phosphide, metal-selenide, metal-chloride and metal-arsenide nanoparticles, for example, may serve as the first nanoparticles, as they are able to provide the required permittivity difference for achieving the electric field-concentrating effect.

Most preferred size range for the nanoparticles is 1 . . . 100 nm (in terms of average diameter), which is also the typical width range of the self-organized localized electrodes.

More specifically, the method, electronics module, devices and use are characterized by what is stated in the independent claims.

Several advantages are obtained by means of the invention. It has been surprisingly found that by applying an electric field applied over the composite of the above kind results in extremely small contacts between the electrodes and the nanoparticles. That is, one can realize extremely compact (high-density) electrical devices. An example of potential application is high capacitance density capacitors. Another potential application is non-volatile memory where each bit is based on a single ferroelectric nanoparticle.

The small particle size provides the possibility to include the particles in nanoparticle suspensions, "nanoinks", that can be conveniently applied on substrates e.g. using printing methods. This opens possibility for high-volume mass production. Nanoinks typically comprise polymer-encapsulated metallic nanoparticles. Other possible deposition methods include aerosol-like deposition [for example, see the M3D deposition process by www.optomec.com].

According to a preferred embodiment, AC-voltage having preferably high frequency (>1 MHZ, typically 100-500 MHz) is used for contact-creation.

Advantageous embodiments of the invention are the subject of the dependent claims.

The nanoparticles are preferably mixed in an insulating matrix, which has the property of irreversibly turning from insulating into conductive by voltage, preferably through a thermally induced structural transformations, such as thermal sintering, or electric-field induced transformations, such as electric sintering.

The insulating matrix may also comprise polymer-encapsulated metallic second nanoparticles.

According to one embodiment, the insulating matrix comprising metal-oxide alloy particles as second nanoparticles. At least ITO or Al:ZnO nanoparticles have been found to have particularly advantageous.

The insulating matrix may also comprise chalcogenide second nanoparticles, such as GeSbTe. This, in combination with the current-density focusing effect of the first nanoparticles, opens new possibilities in producing high-density RAM memories, for example. WORM- and ROM-type memories can be produced even without chalcogenide materials. When chalcogenide materials are used in the filling layer, the field-focusing nanoparticles can be conductive, because the whole structure remains insulating or lossy because of the chalcogenides (i.e., no electrical short is formed between the electrodes). For the same reason, in this application, the transformation-inducing voltage can be of DC-type, instead of AC-voltage used when insulating field-focusing nanoparticles are used.

According to one embodiment, a structure and voltage are used, which induce complete melting and subsequent recrystallization of at least the first nanoparticles. This offers the possibility of utilizing the material contained in the first nanoparticles efficiently for the contact creation. In addition or alternatively, localized melting of the electrodes and/or second nanoparticles may be taken advantage of in order to create said contacts.

In particular, the present invention is applicable for very thin intermediate layers, thus allowing electrical contacting of both of the electrodes to a single nanoparticle. The thickness of the intermediate layer is usually less than 1 μm, typically 50-500 nm. Very localized contact are obtained, if the thickness is less than three, preferably less than two times the average diameter of the first nanoparticles.

It has also been observed that the field-focusing effect of nanoparticles increases significantly if the inter-distance of the particles is less than 5, preferably less than 2.5 times the average diameter of the particles.

The substrate the sandwich structure is manufacture on can be a paper, a cardboard or a polymer film, for example. Printing, preferably ink-jet printing, or aerosol-deposition can be used as the deposition method for applying the layers onto the substrate.

The particles are preferably spherical or at least have a small aspect ratio.

By localized structural transformations between the electrodes and individual first nanoparticles we mainly mean any such change in the vicinity of the nanoparticles, which causes the electrical properties of the electrical pathway between the electrodes change. In particular, we mean such transformations, which cause at least one decades change in the local conductivity. As will become clear through the detailed description, this situation may be achieved in many ways, however typically through melting of the electrodes and/or first nanoparticles, at least partial sintering of the filler matrix, or chalcogenic phase change taking place in the filler matrix. In this document, electrical (ohmic) contact creation between the electrodes and nanoparticles is frequently used as an example, this being the most typical application. However, depending on the material properties, also other kind of structural changes, such as those resulting in some other low-impedance coupling, e.g. a low-impedance capacitive coupling, between the electrodes and the nanoparticles, may take place. The term "low-impedance coupling" in this context means primarily such electrical pathways which have significantly, preferably at least an order of magnitude, better conductivity (either DC or AC) than the surrounding remaining filler material.

Although usually structures containing a plurality of first nanoparticles are fabricated using the present method, it can be applied to structures containing only a single first nanoparticle.

DETAILED DESCRIPTION OF THE EMBODIMENTS

Figure 1:
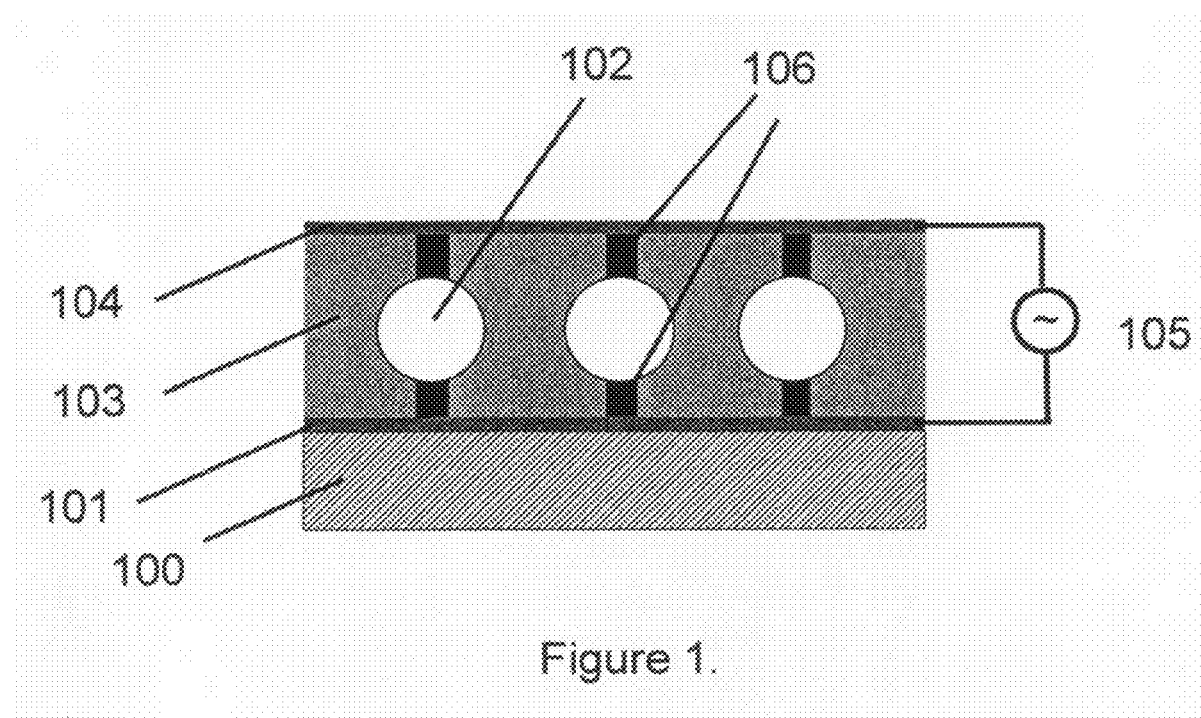
FIG. 1. A schematic representation of the basic aspects of the invention: the sandwich (parallel plate capacitor) structure containing the nanoparticles.

To illustrate one aspect of the invention, FIG. 1 shows a simplified representation of a parallel-plate sandwich structure in which the insulating layer 103, containing the nanoparticles 102, separates the two electrodes 101 and 104. The structure is realized on a substrate 100. The electric power source and connections 105 are applied to create a potential difference between the electrodes 101,104 and to induce electrode 106 formation to the nanoparticles 102 (irreversible structural transformation leading to electrical conductivity) as explained in detail below.

Figure 2:
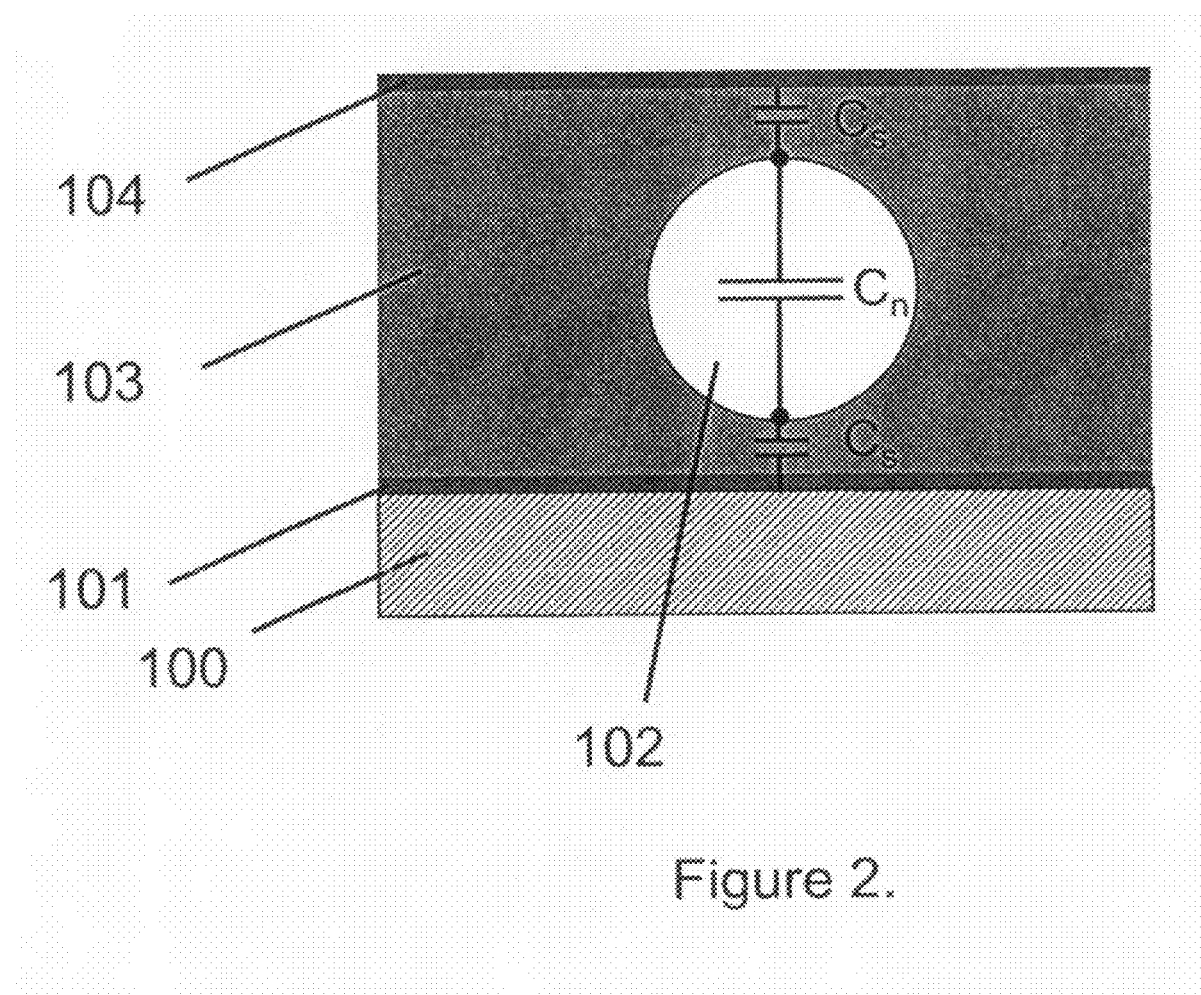
FIG. 2. A simplified sandwich structure of a single nanoparticle.

Many metal-oxides, such as titanium oxides, exhibit high dielectric permittivity (typically $\in_r$~100 or more). In contrast, the typical insulating "filler" materials have dielectric permittivity significantly smaller ($\in_r$~10 or below). Therefore, as depicted in FIG. 2, the series capacitance CS induced by the filler effectively screens the nanoparticle 102 from experiencing the full electric field created between the electrodes 101, 104. The structure in FIG. 2 is a simplified geometry based on a single nanoparticle, with the series capacitances $C_s$ and the effective nanoparticle capacitance $C_n$ indicated.

Figure 3:
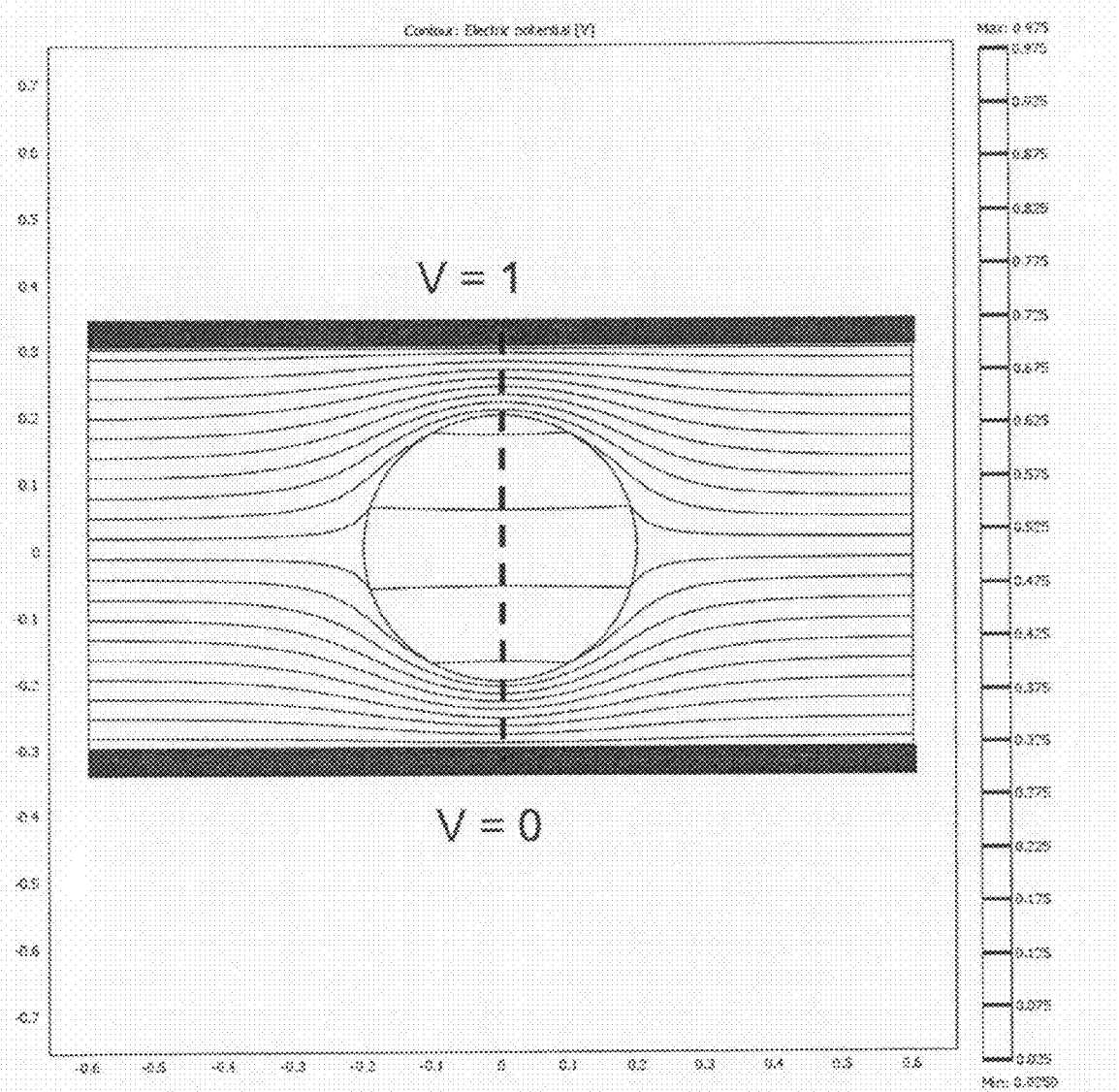
FIG. 3. The electrostatic potential distribution as calculated by finite-element-method.
Figure 4:
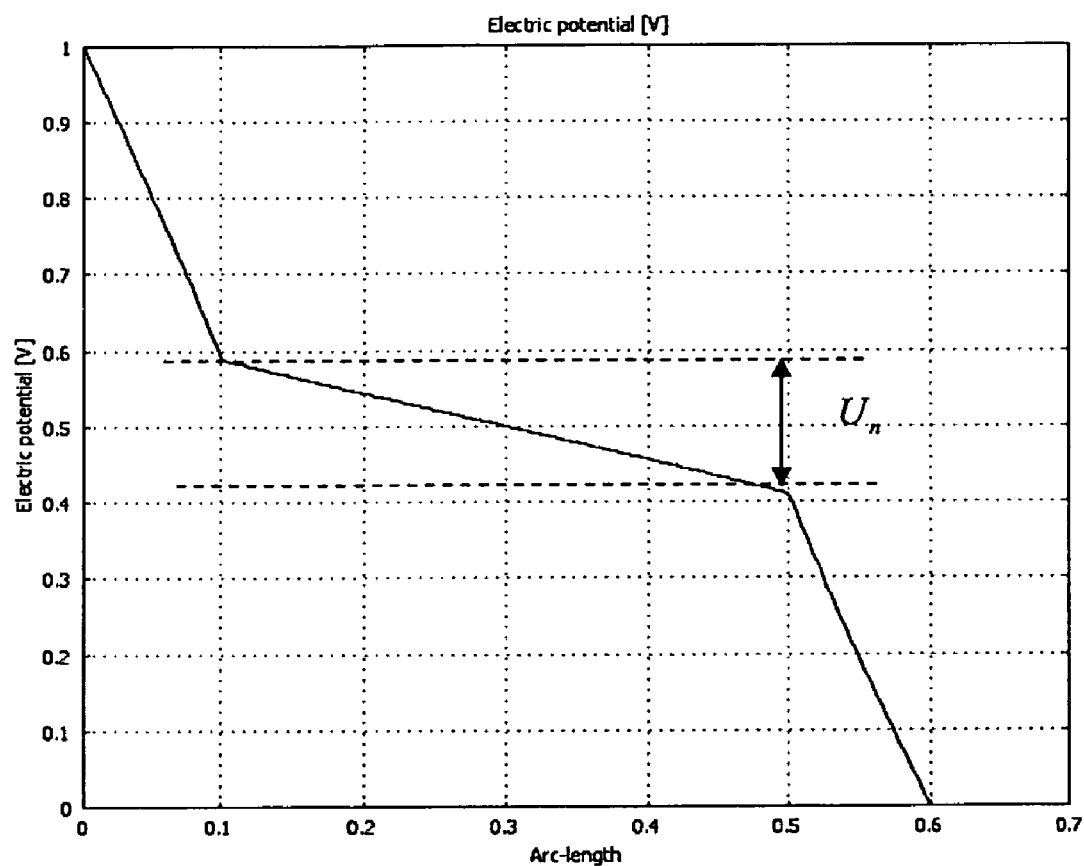
FIG. 4. The electrostatic potential across the cross-section shown as a dashed line in FIG. 3 as calculated by finite-element-method.

FIGS. 3 and 4 further illustrate the shielding effect based on the results of an electrostatic finite-element-method simulation assuming $\in_r$~100 for the nanoparticle and $\in_r$~10 for the filler material. The electrostatic potential surfaces (FIG. 3) and the calculated electrostatic potential (FIG. 4) along the dashed line cross-secting the nanoparticle in FIG. 3 indeed quantify the large potential drop over the "filler" material and the small potential drop $U_n$ over the nanoparticle.

As described earlier in the text, the electrostatic shielding is highly detrimental in such parallel plate nanoparticle structures. For example, obtaining high-permittivity capacitor structure based on the high permittivity nanoparticles becomes difficult. As another example, the realization and operation of a memory cell based on ferroelectric nanoparticles (exhibiting spontaneous and switchable polarization) is hindered. Therefore, it is highly desirable if one can realize a structure in which direct electrode contacts to the metal-oxide nanoparticles can be created.

Figure 5:
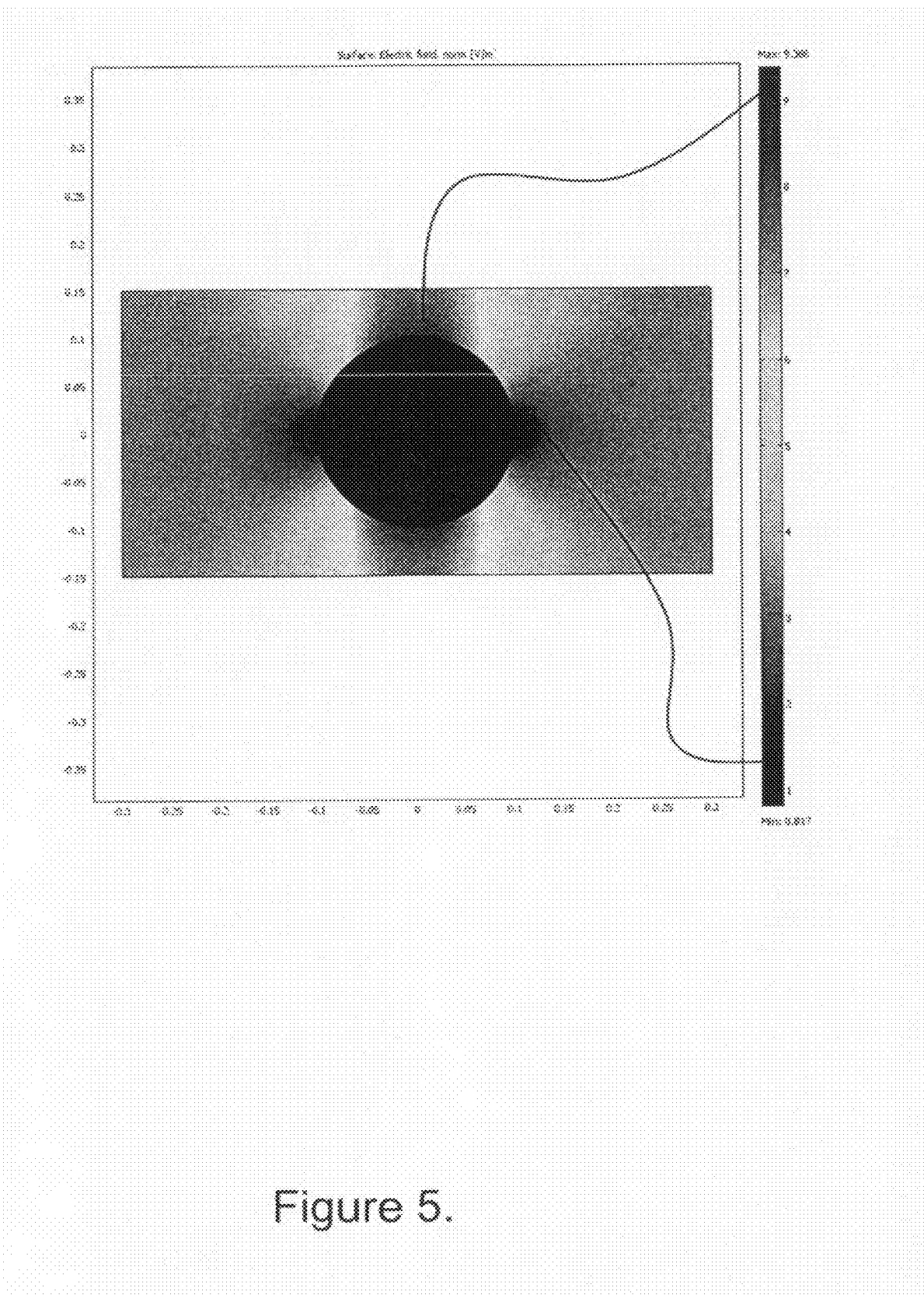
FIG. 5. The electric field distribution as calculated by finite-element-method.

In one aspect of the present invention, the electrode contacts are realized by utilizing the concentration of electric field based on the permittivity difference between the filler 103 and the nanoparticles 102. As illustrated in FIG. 5, which shows the result of the electrostatic finite-element simulation (geometry and parameters as above), the electric field concentrates on top and below the high-permittivity nanoparticle. Thus, by applying an AC electric field across a layer containing the metal-oxide nanoparticles, the electric field maxima can be used to create electrode contacts (FIG. 1) to the nanoparticles via electrically-induced structural transformation such as electrical sintering. The electric field non-uniformity restricts the induced conductivity change to the regions on top and below the nanoparticle(s). The exposure to the applied field is controlled is such a way that it induces the desired electrode formation at the nanoparticle locations while keeping the remaining structure unsintered. The typical mechanism for the structural transformation is the temperature increase, but the material conductivity may also be directly transformable using the field intensity. Materials exhibiting such large, irreversible conductivity changes under electric exposure include e.g. (i) metallic nanoparticle polymer composite inks featuring "electrical sintering", (ii) metal-oxide alloys e.g. ITO (Indium Tin Oxide), Al:ZnO. Also, chalcogenide materials (e.g. GeSbTe) may be applied, however, in a way that the reverse phase transition from well-conducting crystalline structure to worse-conducting amorphous phase is prevented. It should be noted that the method does not require heating of the entire structure (in particular the electrodes 101,103 or the substrate 100 in FIG. 1) but the heat generation can be strongly localized, and therefore the high temperatures required for sintering e.g. metal-oxides (for example, ITO, T>300° C.) or chalcogenides (T>600° C.) are accessible.

In the case of ferroelectric nanoparticles that exhibit spontaneous polarization, the hysteresis losses may also be used in electrode creation. At a suitable AC-field intensity and frequency, the hysteresis losses in the electric polarization induce heating of the nanoparticle and may critically aid in transformation of the filler layer into conductive electrodes. This may further be applied in creating electrode contacts to ferroelectric nanoparticles only (separation from non-ferroelectric particles which do not exhibit hysteresis losses).

Figure 6A:
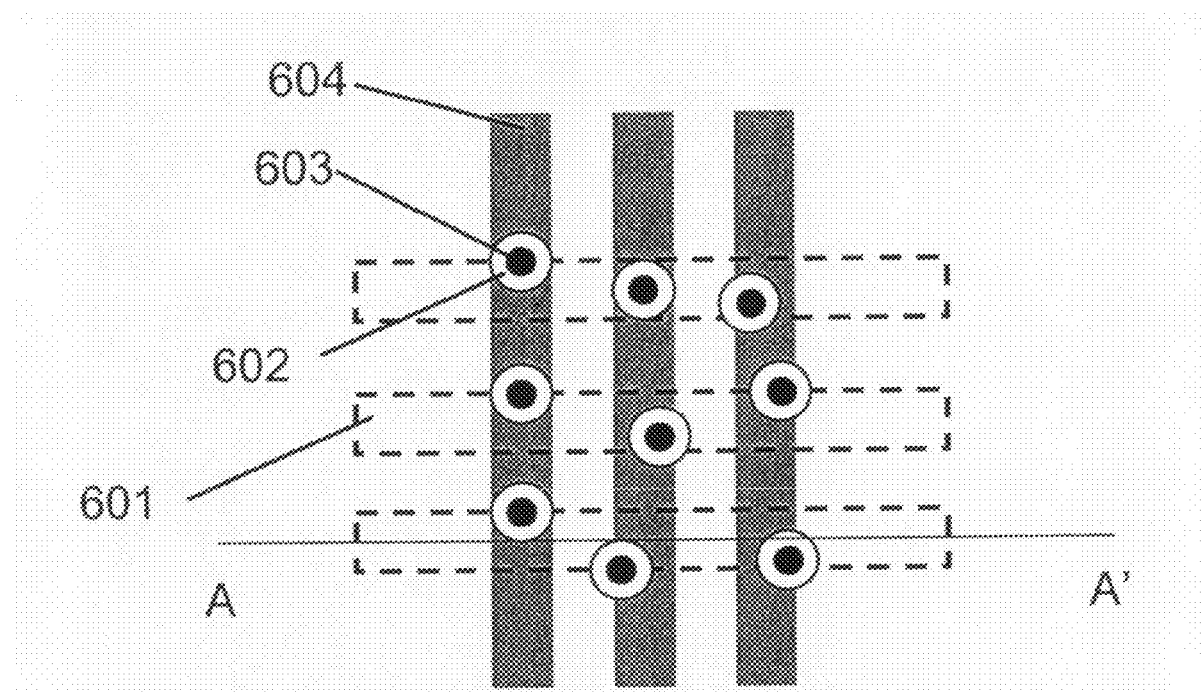
FIG. 6a. A schematic representation of a matrix memory structure where the nanoparticles may exhibit randomness in their positions (top view).
Figure 6B:
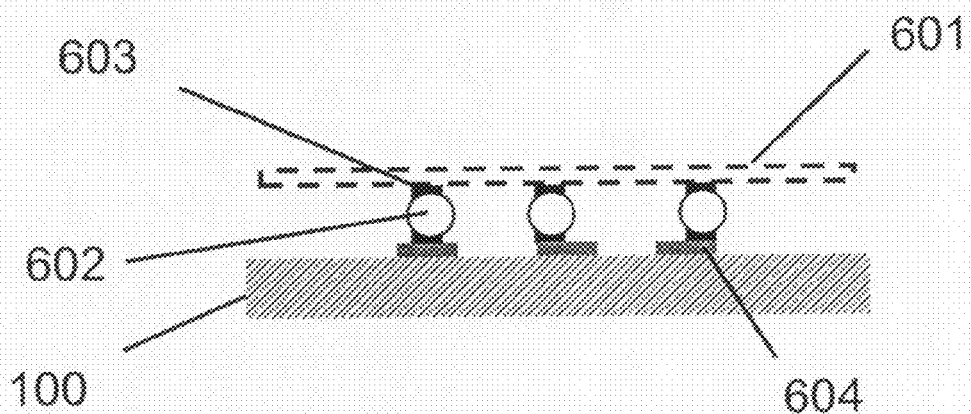
FIG. 6b. A schematic representation of a matrix memory structure where the nanoparticles may exhibit randomness in their positions (cross-sectional view).

The electrical contacts are formed at the nanoparticle locations in a self-organized manner. This forms another key advantage of the present invention. To illustrate this, let us consider the creation of one-particle memory cell array as an example [FIG. 6a (top view) and 6b (cross section view)]. Conventionally, high resolution lithographic techniques are required to pattern the cross-secting electrodes 601, 604 structure. However, the deposited nanoparticle array is typically not perfectly ordered, but can exhibit e.g. bias and random effects in particle positions as illustrated schematically in FIGS. 6a and 6b. Using the invented method, the positioning accuracy of the electrode structure vs. the nanoparticles can be significantly relaxed as the electrode contacts 603 to the nanoparticles 602 are created in a self-organized way.

Figure 7:
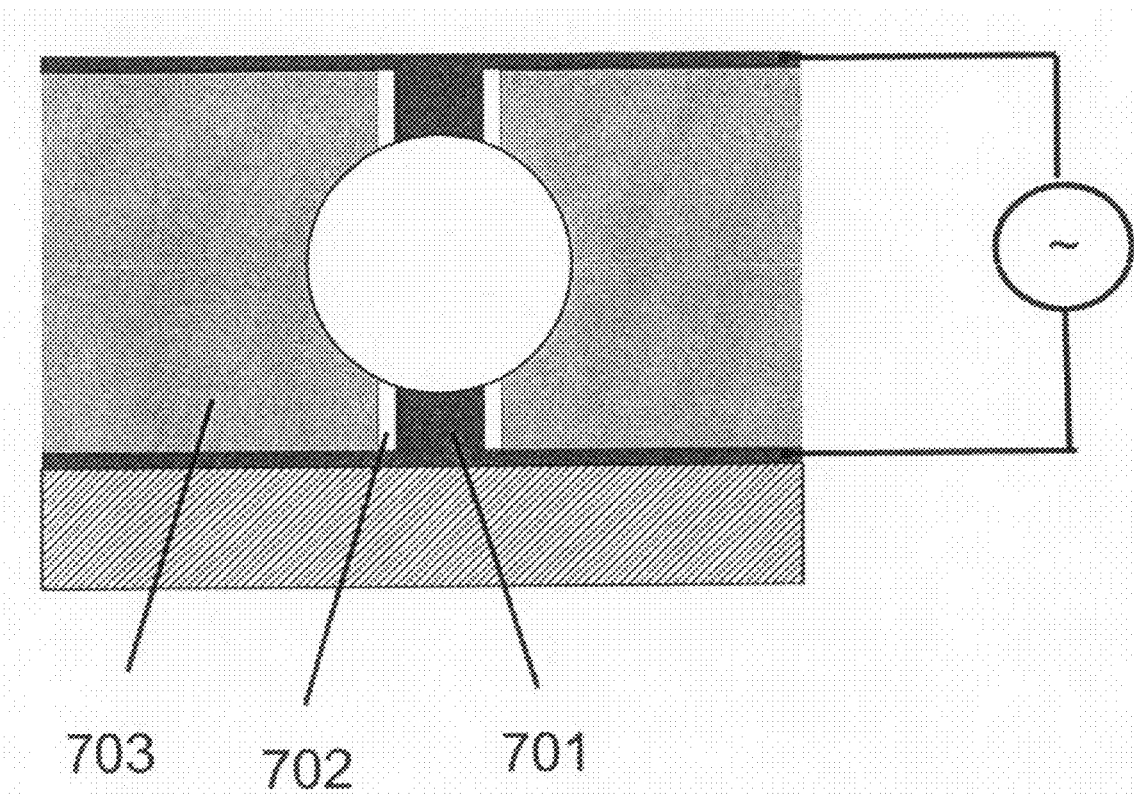
FIG. 7. A preferred embodiment of the invention where an insulating gap is induced between the electrode contacts and the remaining material.

The electric field exposure can be optionally performed so that the created electrodes 701 consist of melted and recrystallized nanoparticle material (FIG. 7). In such a case, a gap 702 is typically induced that separates the electrode from the remaining nanoparticle array 703 due to large volume reduction (shrinkage) experienced during melting and recrystallization. This is advantageous in increasing the relative conductivity difference between the induced contacts 701 and the remaining filler material 703.

Figure 8:
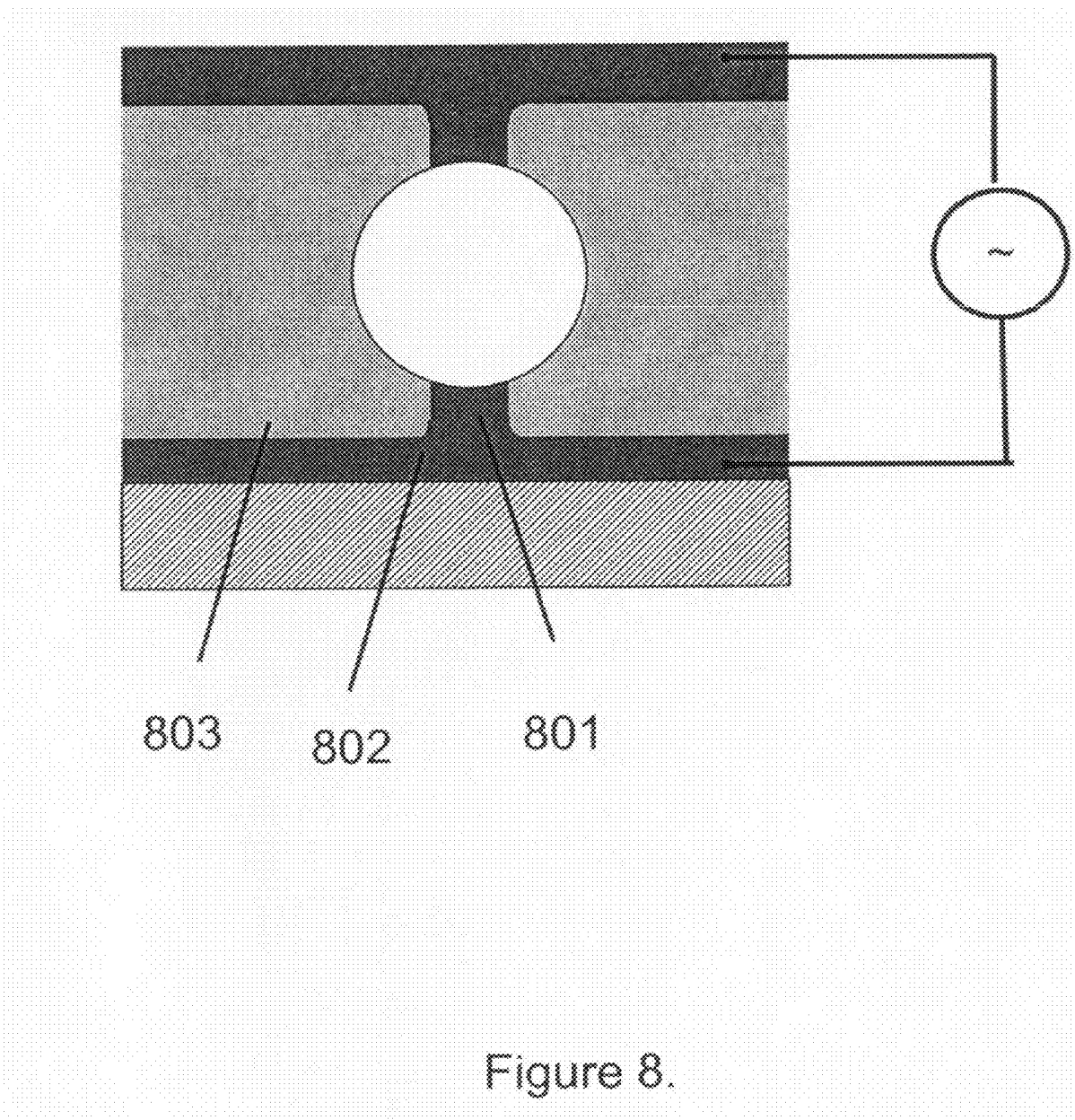
FIG. 8. A preferred embodiment of the invention where, under electrical exposure, the filler material yields and the electrode material fills the volume induced, thus creating an intimate electrode to the nanoparticle.

Another possibility for electrode creation, a shown in FIG. 8, is that during electrical heating the filler material 803 yields and the electrode 802 flows and fills the induced volume and thus creates electrodes 801 to the nanoparticles.

Figure 9:
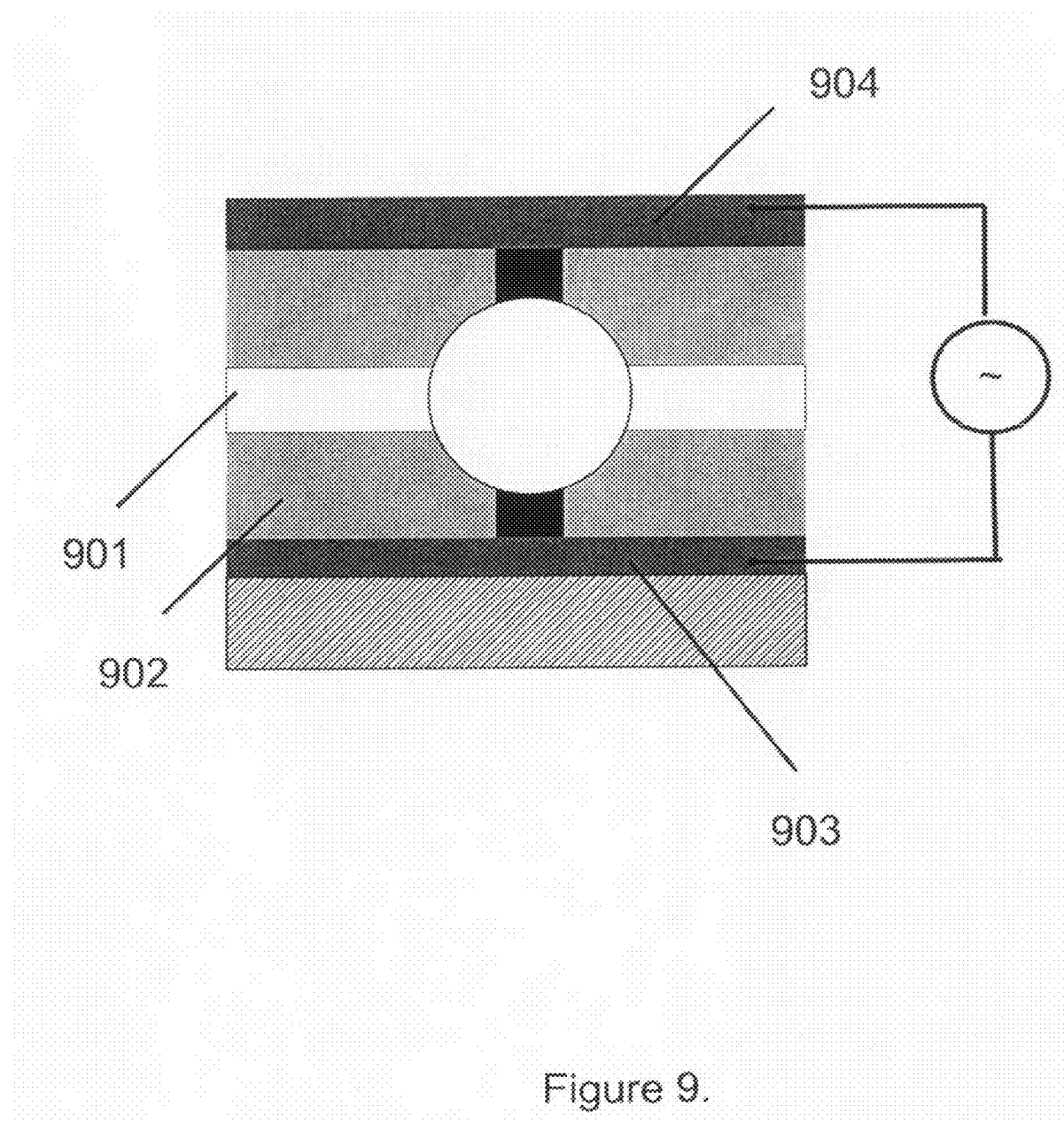
FIG. 9. A preferred embodiment of the invention where an insulator layer is utilized for additional advantages.

Optionally, as shown in FIG. 9 an additional insulator 901 layer may be applied in the structure so that it serves to provide further insulation in electrical conductivity between the electrodes 903 and 904. Thus, an additional insulating material layer, preferably of different material than the intermediate layer, within the filler matrix, so as to further electrically isolate the electrodes from each other can be used. In such a structure, the specifications for the insulation capability of the "electrically sintrable" material 902 can be relaxed.

The described parallel plate capacitor structures can be realized in practice e.g. as follows:
(i) (1) All the material layers are first deposited, utilizing suitable intermediate steps such as drying between successive material layers. (2) Top and bottom electrode layers are thermally sintered, unless being not sintered already during step (1). (3) The electrode contacts to metal-oxide nanoparticles are electrically created using the invented method.
(ii) As in (ii) but electrical sintering is used for sintering the top and bottom electrode layers.

Figure 10:
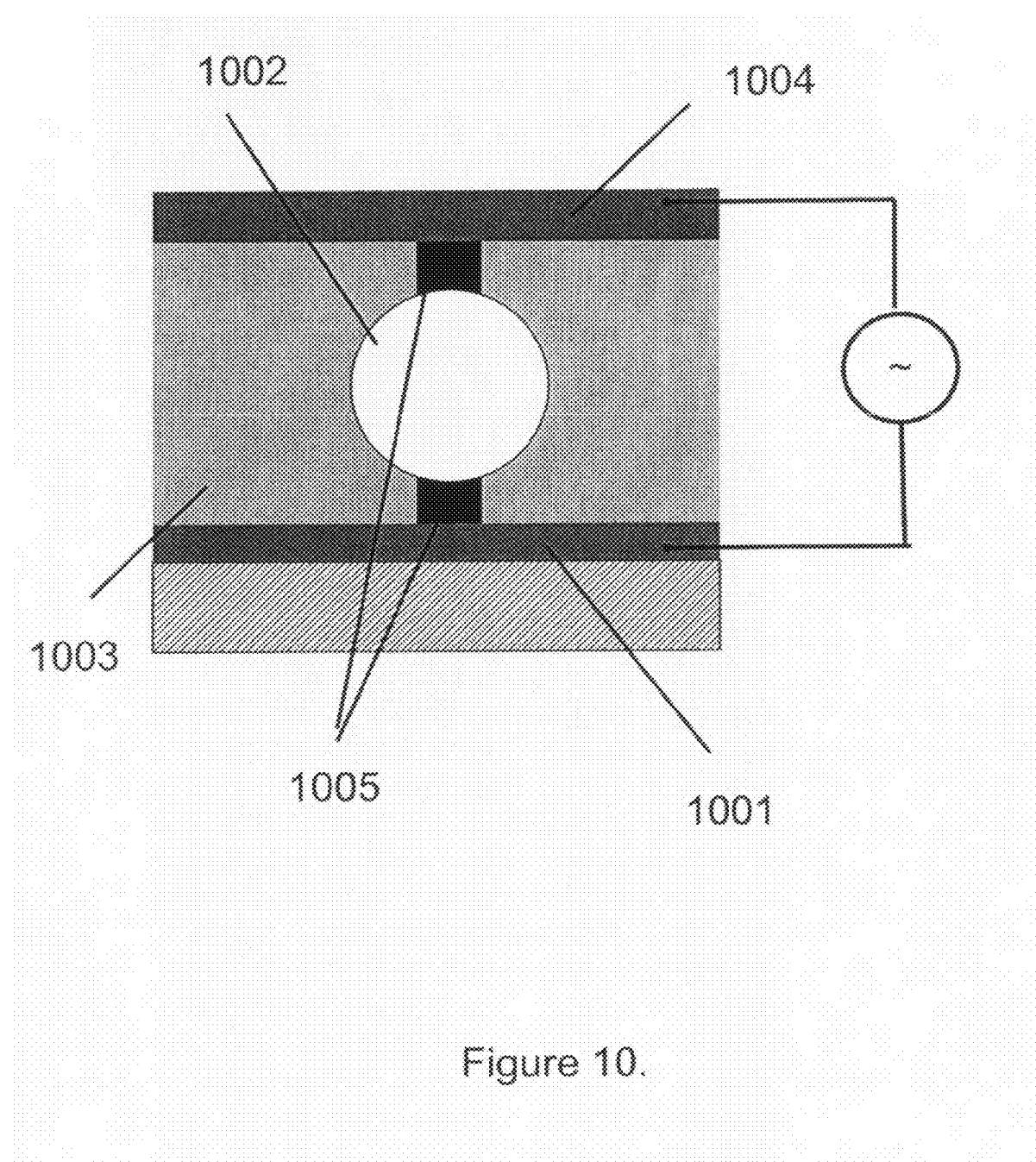
FIG. 10. The invented structure for implementing chalcogenide memory cell.

In another aspect of the present invention, a similar method based on nanoparticles may be utilized in creating a phase change (chalcogenide) memory. As shown in FIG. 10, the nanoparticle 1002 is again utilized to concentrate the electric current (AC or DC) into the locations on top and below the nanoparticle. If the filler layer 1003 spacing the electrodes 1001, 1004 is of phase transformable (chalcogenide) material, the electricity applied between the electrode 1001, 1004 can be used to induce the phase transition in the areas 1005 on top and below the nanoparticle 1002. The key function of the nanoparticle is again to focus the current flow into the narrow region, thus allowing to reach the high current density required for inducing chalcogenide phase transformation. This can be realized, for example, (i) utilizing the large difference in imaginary part of the conductivity (high permittivity, such as metal-oxide, nanoparticle 1002) between the nanoparticle and the surrounding material, typically in the case of AC-current, (ii) utilizing the large difference in real part of the conductivity in the case of DC-current (now the nanoparticle 1002 may be e.g. metallic one). In such chalcogenide memory arrangement, an additional insulator layer, similar to the shown may be advantageously used.

Figure 11:
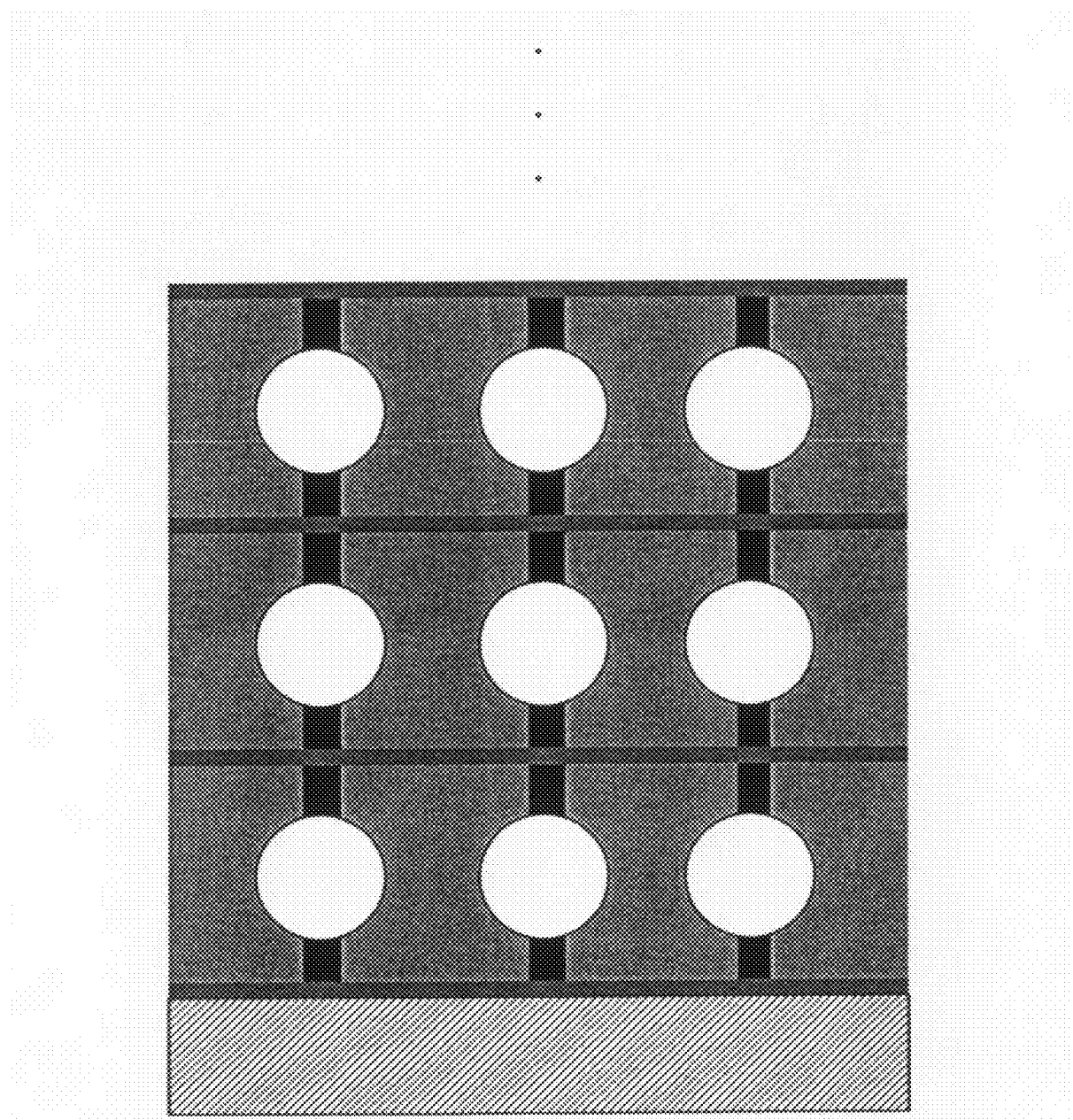
FIG. 11. A three-dimensional memory structure based on stacking of the sandwich structures.

In addition to sandwich structures illustrated earlier, the invention is also well suited for realizing multi-layer 3D structures as illustrated in FIG. 11.

The invention claimed is:

1. A method for producing nanoscale formations in a structure comprising
a filler matrix and at least one first nanoparticle embedded in the filler matrix, and
two conductive electrodes superimposed on opposite sides of the filler matrix, said method comprising:
applying a voltage between the conductive electrodes, and
utilizing the first nanoparticle having a substantially higher relative permittivity than the filler matrix and being insulating, for concentrating electrical field in the vicinity of the first nanoparticle in order to induce a localized structural transformation between at least one of the electrodes and the first nanoparticle when said voltage is applied.

2. A method according to claim 1, wherein the at least one first nanoparticle is a nanoparticle having a relative permittivity of 10 or higher.

3. A method according to claim 1, wherein the filler matrix is an insulating filler matrix.

4. A method according to claim 1, wherein the at least one first nanoparticle is a metal-oxide nanoparticle.

5. A method according to claim 4, wherein the metal-oxide nanoparticle is a $BaTiO_3$, $SrTiO_3$, $TiO_2$ or $PbZrTiO_3$ nanoparticle.

6. A method according to claim 1, wherein the at least one first nanoparticle is a ferroelectric nanoparticle.

7. A method according to claim 6, wherein the ferroelectric nanoparticle is a $BaTiO_3$, $SrTiO_3$, $PbZrTiO_3$ or $Ba_xSr_{1-x}TiO_3$ nanoparticle.

8. A method according to claim 1, wherein the voltage applied is an alternating voltage.

9. A method according to claim 8, wherein the alternating voltage has a frequency of at least 1 MHz.

10. A method according to claim 8, wherein the alternating voltage has a frequency of 100-500 MHz.

11. A method according to claim 1, wherein the filler matrix has the property of irreversibly turning from insulating into conductive by said voltage.

12. A method according to claim 11, wherein the filler matrix turns from insulating into conductive by said voltage through thermally induced structural transformations or electric-field induced transformations, in order to create an ohmic or low-impedance contact between the electrodes and the nanoparticle.

13. A method according to claim 1, wherein the filler matrix comprises a metal nanoparticle polymer composite.

14. A method according to claim 13, wherein the metal nanoparticle polymer composite includes polymer-encapsulated metal nanoparticles.

15. A method according to claim 1, wherein the filler matrix comprises a metal-oxide alloy.

16. A method according to claim 15, wherein the metal-oxide alloy is ITO or Al:ZnO.

17. A method according to claim 15, wherein the metal-oxide alloy is ITO or Al:ZnO, in nanoparticle form.

18. A method according to claim 13 or 15, wherein the voltage induces at least partial melting and subsequent recrystallization of the metal.

19. A method according to claim 1, wherein the filler matrix comprises a material exhibiting a reversible conductivity change due to exposure to said voltage.

20. A method according to claim 19, wherein the material exhibiting a reversible conductivity change due to exposure to said applied voltage is a chalcogenide material.

21. A method according to claim 20, wherein the chalcogenide material is GeSbTe.

22. A method according to claim 21, wherein the chalcogenide material is GeSbTe in nanoparticle form.

23. A method according to claim 1, wherein a structure is used utilized together with said voltage to cause localized melting of said electrodes in order to create ohmic contacts as said structural transformations.

24. A method according to claim 1, wherein at least one of said electrodes is formed on a substrate by
    applying a layer of liquid suspension containing conductive nanoparticles,
    drying the layer, and
    sintering the nanoparticles in order to form a conducting electrode and the filler matrix is formed by
    applying a layer of liquid suspension containing first nanoparticles, and
    drying the layer.

25. A method according to claim 1, wherein said filler matrix has a thickness less than three times the diameter of the first nanoparticle.

26. A method according to claim 1, wherein both of said electrodes are formed on a substrate by
    applying a layer of liquid suspension containing conductive nanoparticles,
    drying the layer, and
    sintering the nanoparticles in order to form a conducting electrode and the filler matrix is formed by
    applying a layer of liquid suspension containing first nanoparticles, and
    drying the layer.

27. A method according to claim 1, wherein said filler matrix has a thickness less than two times the diameter of the first nanoparticle.

28. A method according to claim 1, wherein
    a plurality of first nanoparticles are utilized, and
    said filler matrix has a thickness which is less than three times an average diameter of the first nanoparticles.

* * * * *